(12) United States Patent
Verhaverbeke

(10) Patent No.: US 7,011,715 B2
(45) Date of Patent: Mar. 14, 2006

(54) ROTATIONAL THERMOPHORETIC DRYING

(75) Inventor: Steven Verhaverbeke, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 186 days.

(21) Appl. No.: 10/407,692

(22) Filed: Apr. 3, 2003

(65) Prior Publication Data

US 2004/0194801 A1 Oct. 7, 2004

(51) Int. Cl.
*B08B 7/04* (2006.01)
*B08B 3/02* (2006.01)

(52) U.S. Cl. .................. 134/33; 134/34; 134/35; 134/36

(58) Field of Classification Search .......... 134/33, 134/34, 26, 30, 31, 36, 902, 32, 35
See application file for complete search history.

(56) References Cited

U.S. PATENT DOCUMENTS

| | | | |
|---|---|---|---|
| 5,882,433 A * | 3/1999 | Ueno | 134/31 |
| 6,221,168 B1 * | 4/2001 | Carter et al. | 134/1 |
| 6,398,975 B1 | 6/2002 | Mertens et al. | |
| 6,406,551 B1 * | 6/2002 | Nelson et al. | 134/3 |
| 6,491,764 B1 | 12/2002 | Mertens et al. | |

* cited by examiner

*Primary Examiner*—Michael Barr
*Assistant Examiner*—Saeed Chaudhry
(74) *Attorney, Agent, or Firm*—Blakely Sokoloff Taylor & Zafman

(57) ABSTRACT

A method that includes rotating a wafer, heating the wafer, applying a first liquid through one or more nozzles to a center of a topside of the wafer that is cooler than the heated wafer, and translating the one or more nozzles to an outer diameter edge of the wafer.

37 Claims, 3 Drawing Sheets

ROTATIONAL THERMOPHORETIC DRYING

BACKGROUND OF THE INVENTION

1. Field of the Invention

The present invention relates to the field of cleaning of a substrate surface and more particularly to the area of chemical cleaning of a semiconductor wafer.

2. Discussion of Related Art

In semiconductor wafer substrate (wafer) cleaning, particle removal is essential. Particles can be removed by chemical means or by mechanical means. In current state of the art, particles are usually removed by both a combination of mechanical means and chemical means. "HF-Last" (a last hydrofluoric acid etch) processing poses distinct problems to the process engineer such as how to produce a particle-free hydrophobic bare silicon wafer at sub-0.10 micron line widths, while also being able to produce a completely watermark-free "mix-surface" patterned wafer. The mixed surface identifies both hydrophilic oxides as well as hydrophobic bare silicon on the same wafer. While one process may work well for one, it may not work well for both.

Watermarks are among the most common contamination problems found in LSI wet processing today, principally attributed to post HF rinsing and drying processes where both hydrophobic and hydrophilic surface states exist on the wafer. Hence, some of the main concerns driving the development of HF-last wafer processing equipment are, the elimination of watermarks, the reduction of the undesired surface reactions, such as, oxide growth, and a neutral particle contamination capability at or below 0.10 micrometers ($\mu$m). Watermarks are contamination formations, typically hydrated silicon-oxides, that appear after the drying of post-HF etched and rinsed, wet processed patterned wafers where both hydrophilic silicon oxides and hydrophobic silicon surfaces exist.

So far, mechanical agitation in a single wafer cleaning method has been achieved in several ways. At first, when wafers are completely flat, brushes can be used to scrub the wafer surface. However, this method is not possible when the wafers have any topography (patterns) that can be damaged by the brushes. Moreover, the brushes don't reach in between the wafer patterns.

Contamination left on the device side can cause a malfunctioning device. Contamination left on the non-device side (backside) can cause a number of problems. Backside contamination can cause the photolithography step on the front side to be out of focus. Contamination on the backside can cause contamination of the processing tools, which in turn can be transferred to the front side of the wafer. Finally, metallic contamination on the backside, when deposited before a high temperature operation, can diffuse through the silicon wafer and end up on the device side of the wafer causing a malfunctioning of the device.

SUMMARY OF THE INVENTION

A method is disclosed for rotational drying a single wafer during a cleaning process by using a thermophoretic force to enhance the cleaning process overall by further removing particles remaining on the wafer. The thermophoretic drying process may not need to use conventional drying chemistries and can be applied at any stage in the cleaning process where drying is required. Rotational thermophoretic drying can be accomplished by spinning the wafer while both heating and cooling the wafer to generate a temperature gradient, i.e. thermophoretic forces that are capable of removing particles such as those that leave watermarks.

During a wafer cleaning process, cleaning and rinse solutions may be applied to one or both sides of the wafer positioned in a rotatable platter. Wafer drying can be required, such as, for example, after a final (last) hydrofluoric acid (HF) etch cycle. After the HF-Last etch, the rotational thermophoretic drying of the patterned or blanket hydrophobic wafer top surface can be performed and, as a result, the wafer top surface can have reduced watermarking or be watermark-free.

Single wafer cleaning can be accomplished within a single wafer cleaning chamber. Within the cleaning chamber, a cleaning cycle can involve cleaning, rinse, and drying processes. The application of cleaning and rinse solutions can be applied to the wafer device side and the wafer non-device side and simultaneous with any or all of the cleaning, rinse, and drying processes, megasonic energy may be applied to the wafer.

DETAILED DESCRIPTION OF THE PRESENT INVENTION

Figure 1:
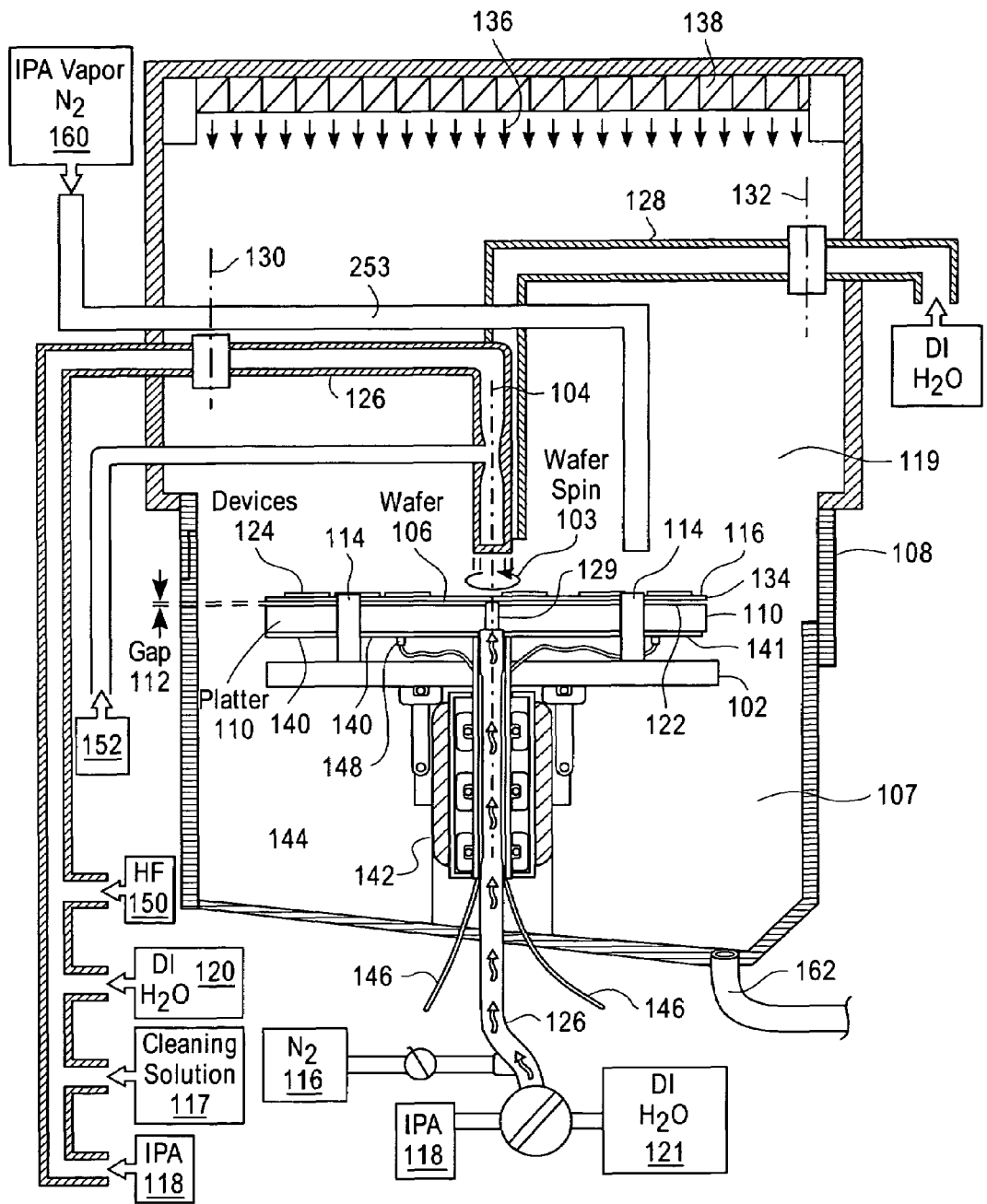
FIG. 1 is an illustration of one embodiment of a single wafer cleaning chamber.

A method to provide rotational thermophoretic drying of a wafer within a single wafer cleaning chamber is disclosed. The method to use rotational thermophoretic forces in a wafer dry cycle can remove particles on the wafer surface, such as, for example, to provide watermark-free rotational drying of patterned or blanket hydrophobic semiconductor wafers.

During wafer cleaning, a cleaning or rinse solution can be applied to one or both sides of a wafer positioned in a rotatable platter. The cleaning process, such as an RCA-type cleaning process, can be applied to the wafer and after which, a final (last) hydrofluoric acid (HF) etch can be accomplished. A rotational thermophoretic drying process can then be performed.

Thermophoretic forces can be exerted on particles through the generation of a temperature gradient. The thermal gradient can cause the repulsion of small colloidal sized particulates, suspended in a surrounding (cooler) liquid layer, away from a (hotter) wafer surface. With particles moving toward the lower temperature region, such motion can result in a net force on the particles caused by unequal momentum transfer from hot and cold gas molecules colliding with each particle. If the temperature gradient is moved, the movement of the particles can be increased in the direction of the movement.

In one embodiment for rotational thermophoretic drying, a wafer holding chuck can rotate to spin a heated wafer. The wafer can be heated, such as, for example, by applying hot dionized water onto a bottom side of the wafer while cold dionized water can be applied to a topside of the wafer. The cold dionized water can be applied through one or more nozzles where the nozzles can be capable of translation. The drying sequence can commence when arms holding the nozzles begin to sweep from a center of the wafer to an outer diameter edge. Such nozzle translation can develop a traveling temperature gradient and as a result, a traveling liquid-to-dry wafer interface. Because the wafer is significantly hotter than the liquid applied to the wafer top surface, any particles that are present in the top surface liquid can be repelled from the wafer surface to be carried away in the cooler liquid layer leaving the wafer as it dries. A result can be that as the topside wafer surface becomes completely dry, the topside surface can also be particle and therefore watermark free. The wafer bottom side and outer diameter edge can be dried by centrifugal force and evaporation.

Within the single wafer cleaning chamber, cleaning can begin with a wafer positioned, device side up, in a wafer holding chuck (chuck) above a platter. Chemicals such as cleaning and rinse solutions can be transferred through the platter from below to contact the bottom side of the wafer. Cleaning and rinse solutions can also be transferred into the cleaning chamber by nozzles to flow onto or spray the solutions onto the top surface of the wafer. Megasonic sound waves can be emitted from the platter to transfer through the chemicals flowing from below and strike the wafer bottom surface.

Megasonic cleaning uses frequencies beginning at between 350–400 kHz and may use frequencies well into the MHz range. These higher frequencies do not cause the violent cavitation effects found with ultrasonic frequencies. Megasonic energy can significantly reduce or eliminate cavitation erosion and the likelihood of surface damage to the wafer.

Megasonic cleaning can produce more controlled cavitation, where such cavitation forms bubbles that are believed to be an important mechanism in the actual particle removal process because cavitation has sufficient energy to overcome particle adhesion forces and cause particles to be removed. Megasonic cleaning may be improved through the use of a combination of frequencies that can be simultaneously generated, or by changing one or more frequencies during the clean and rinse the cycles, or a combination thereof. Megasonic cleaning may also be improved through a selection of the frequency or frequencies used. The application of megasonic energy can be added to the rotational thermophoretic drying process to improve particle removal.

FIG. 1 is an illustration of one embodiment of a single wafer cleaning chamber. Within the single wafer cleaning chamber 100, a wafer holding chuck (chuck) 102 can be positioned, where the chuck 102 can be capable of both rotation 103 and translation along an axis 104 a distance up and down. A robot arm (not shown) capable of holding a wafer 106 can enter an interior 107 of the chamber 100 through an access door 108 to place the wafer 106 on the chuck 102 when raised (not shown). The chuck 102 can then be lowered (as shown) so as to align the wafer 106 horizontally a distance from a circular platter 110. The wafer 106, resting in the lowered chuck 102, can be parallel to the platter 110 and positioned a distance from the platter 110. The platter 110 can be flat where it faces the wafer 106 and therefore, the distance separating the platter 108 and the wafer 106, i.e. a gap 112, can be uniform. The gap 112 may be in the range of approximately 1–5 millimeters (mm) and preferably approximately 3 mm.

In one embodiment, the wafer 106, when positioned in the chuck 102, can rest on three or more vertical support posts (posts) 114 of the chuck 102. The posts 114 can contain an elastomer pad (not shown) to contact the wafer 106 directly. The wafer 106 can be rotated while cleaning and rinse chemicals 117, 118, and 120 can be dispensed from below to contact the wafer bottom side 122. A tube 126 can connect to a through hole 129 in the platter 110. As a result of wafer 106 rotation (spin) 103, chemicals 118 and 120 applied to the wafer backside 122 can be restricted from reaching devices 124 on the wafer top side 116.

Nozzles 126 and 128 can be positioned over the wafer 106 within approximately 5 mm of the wafer top surface 116. The nozzles 126 and 128 can be capable of rotation 130 and 132, respectively, between a wafer center of rotation 104 and an outer diameter edge 134 of the wafer. The nozzles 126 and 128 can be capable of movement, such as, for example, by pivoting 130 and 132 respectively, to avoid contact with the wafer 106 during wafer 106 placement and removal as well as for use in the rinse, spin and dry cycles. A downward flow of air 136 from a filter 138 such as, for example, a High Efficiency Particulate Arresting (HEPA) filter or an Ultra Low Penetration Air (ULPA) filter can act to maintain the wafer 106 positioned on the posts 114.

In one embodiment, within the cleaning chamber 100, megasonic energy can be generated by one or more acoustic wave transducers (transducers) 140 and 141 attached to the platter 110 and the megasonic energy can pass into the wafer 206 through chemicals 117, 118, and 120 in contact with both the wafer 106 and the platter 110. As a result, the wafer 206 can be cleaned with different combinations and variations of wafer rotation, megasonic energy, and chemical action, all under temperature control. After any cleaning and/or rinsing cycle, the single wafer cleaning chamber 100 can use the rotational thermophoretic process to dry the wafer topside (device) 116.

Positioned beneath the platter 110 can be an electric motor 142 for rotating the chuck 110. A through hole 144 can exist in the electric motor 142 through which can be passed the wiring 146 from the platter 110 along with the chemical transfer tube 126.

Attached to each of the acoustic wave transducers 140 and 141 can be a mechanism to maintain electrical contact such as, for example, a copper spring 148. Soldered to each spring 148 free end can be the wiring leads 146 to form the electrical connections.

In one embodiment, through the nozzles 126 and 128 can pass a number of chemicals such as, for example: the cleaning solutions 117, isopropyl alcohol (IPA) 118, dionized water 120, and hydrofluoric acid (HF) 150. One or both nozzles 126 and 128 can direct a flow onto the wafer device side 116 of any of the chemicals 117, 118, 120, and 150 during processing. The nozzles 126 and 128 can apply the chemicals 117, 118, 120, and 150 to the wafer 106 while the wafer 106 is not moving or while the wafer 106 is spinning. The nozzles 126 and/or 128 can apply the chemicals 117, 118, 120, and 150 at a flow rate to maintain a coating of the chemicals 117, 118, 120, and 150 on the wafer device side 116 surface with minimal excess.

The nozzles 126 and/or 128 can apply a continuous chemical flow to maintain a film thickness on the wafer 206 of at least 100 microns. To keep the chemical film at the 100 microns thickness, the chemicals 117, 118, 120, and 150 may be converted at the nozzle 126 and/or 128 into a mist having a particular mean diameter droplet size. All nozzle designs are limited as to how small a droplet size they can create. To meet the requirements of minimal fluid usage, a further reduction in droplet size may be required. One method of reducing the droplet size beyond a theoretical limit is to entrain a gas into the chemicals.

Figure 2A:
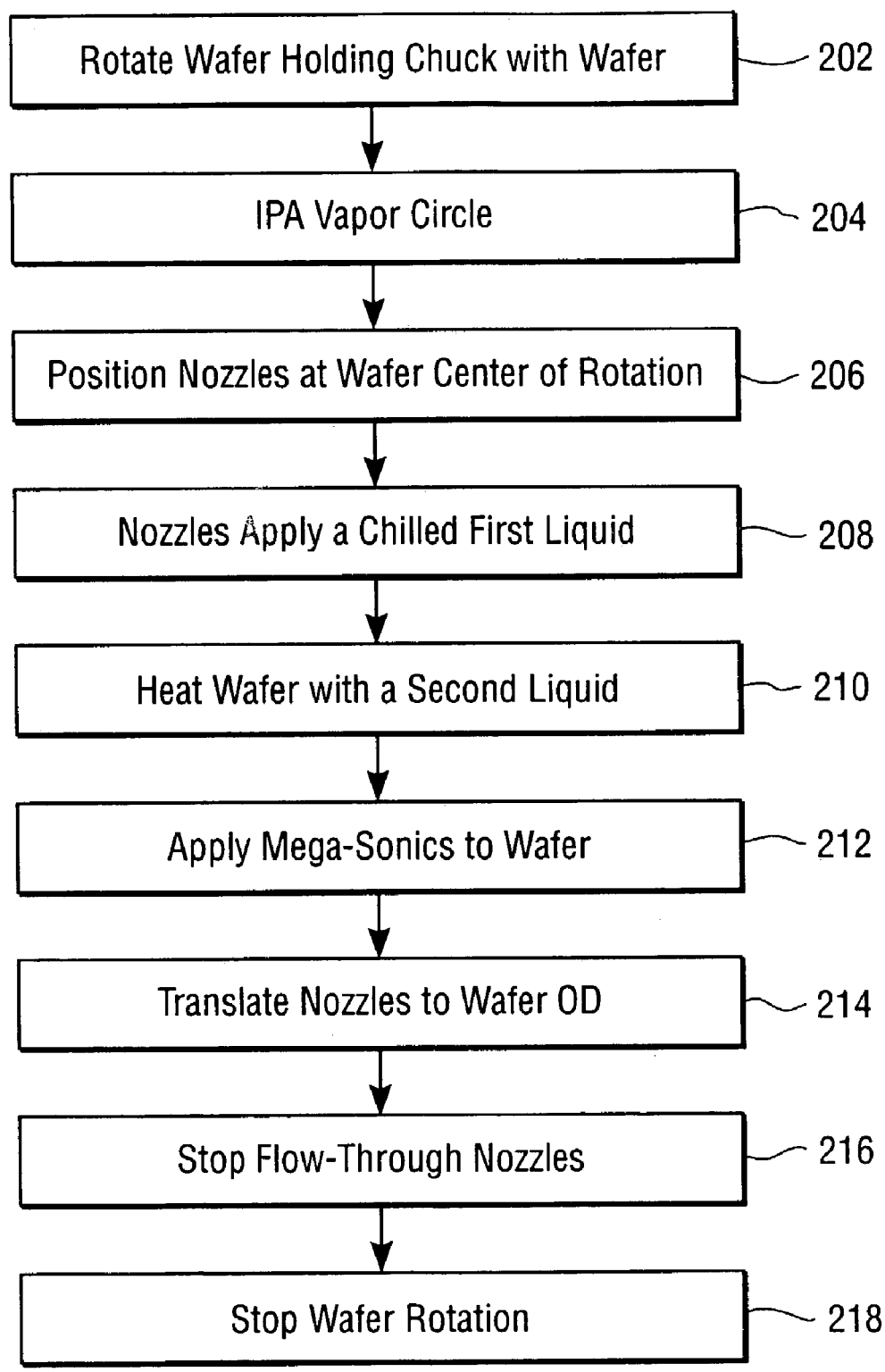
FIG. 2A is a flow diagram of one embodiment of a method of a rotational thermophoretic wafer drying process.

In one embodiment, the nozzle 126 can entrain or dissolve enough gas 152, such as, for example, air, $O_2$, $N_2$, Ar, or He into any mixture of chemicals 117, 118, 120, and 150 to further reduce the mean droplet size FIG. 2A is a flow diagram of one embodiment of a method for rotational thermophoretic drying a wafer. A chuck and a wafer can be rotated at a speed that is at least 1000 rpm (operation 202). An IPA vapor cycle can be accomplished on the wafer (operation 204). One or more nozzles can be positioned above the wafer top surface at approximately the wafer center of rotation (operation 206). The one or more nozzles can apply a first liquid that is chilled to a temperature as low as 4 degrees C. to the wafer top surface (operation 208). The wafer can be heated to a temperature of up to 80 degrees C. by a second liquid that is heated and applied to the wafer bottom side (operation 210). Megasonic energy can be applied to the wafer (operation 212). The nozzles can translate to the wafer outer diameter edge. The nozzle movement rate can be approximately 3 cm/sec in a radial direction across the wafer (operation 214). The one or more nozzles reach the wafer outer diameter edge and flow of the first liquid and the second liquid are stopped (operation 216). Wafer rotation is stopped (operation 218).

Figure 2B:
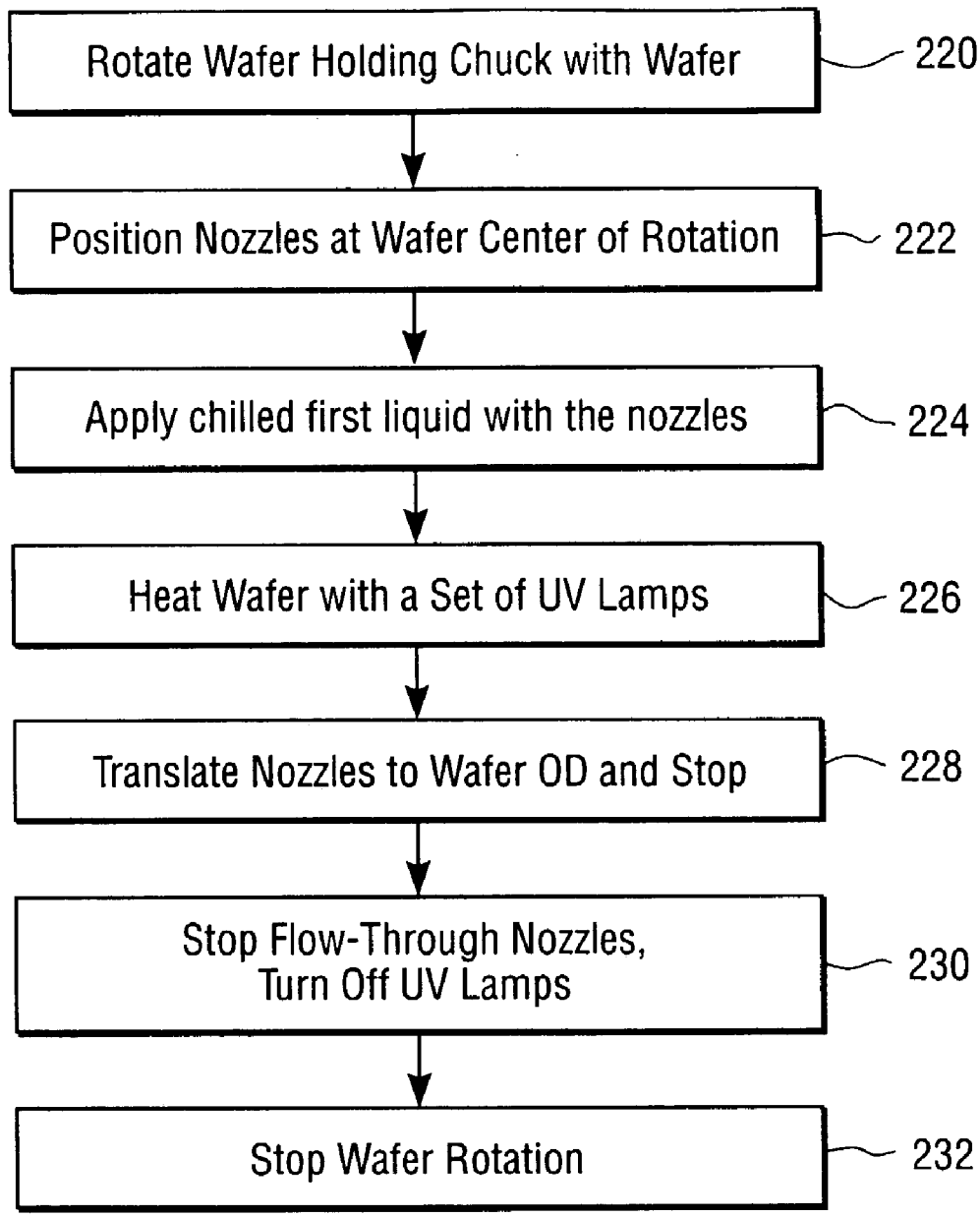
FIG. 2B is a flow diagram of an alternate embodiment of a rotational thermophoretic wafer drying process.

FIG. 2B is a flow diagram of an alternate embodiment of a method for rotational thermophoretic drying a wafer. A chuck and a wafer can be rotated at a speed that is at least 1000 rpm (operation 220). A plurality of nozzles can be positioned above the wafer top surface at approximately the wafer center of rotation (operation 222). The plurality of nozzles can apply the first liquid that is chilled to a temperature as low as 4 degrees C. to the wafer top surface (operation 224). The wafer can be heated to a temperature of up to 80 degrees C. by one or more UV lamps (operation 226). The plurality of nozzles can simultaneously rotate out toward the wafer outer diameter edge, such as, for example, where the plurality of nozzles can rotate in directions that are different from each other. Although rotation in different directions, the position of the plurality of nozzles can maintain a common radius from the wafer center throughout nozzle movement. The rotation rate can be approximately 3 cm/sec in a radial direction along the wafer radius (operation 228). The nozzles reach the wafer outer diameter edge and flow of the first liquid and power to the UV lamps can be stopped (operation 230). Wafer rotation can be stopped (operation 232).

Returning to FIG. 1, during the cleaning, rinse and dry cycles, the wafer 206 can be rotated at a revolution per minute (rpm) that can be varied. Additionally, to optimize any particular cycle, the wafer spin rate may be stopped and the sonic energy varied by changing any combination of the power setting, the frequency or frequencies, and by pulsing. In one embodiment, the chuck 102 can rotate the wafer 106 during the cleaning cycle at an rpm of approximately between 10–1000 and during the dry and rinse cycles at an rpm of greater than 200 rpm where a range of approximately between 250–6000 rpm is preferable.

Megasonic energy can first strike the wafer non-device side 122 where no devices 124 exist that could be damaged by the full force of the acoustic energy. Depending on the frequency or frequencies used, the megasonic energy may be dampened to a degree when passing through the platter 110 and wafer 106 to exit into the solution existing on the wafer device side 116. As a result, the megasonic energy striking the wafer non-device side 122 may be powerful enough that only de-ionized (DI) water is used on the wafer non-device side 122.

During a cleaning cycle, a thin film of the cleaning solution 117, 118, 120, and 150 may be applied to the wafer device side 116. For the wafer bottom side 122, if not DI water 121, the chemistry used may be the cleaning solution 117 such as used in an RCA (Radio Corporation of America) cleaning process.

The RCA type cleaning process, along with the use of an etchant such as hydrofluoric acid (HF) 150 may be used on the wafer device side 116. The RCA cleaning process is commonly used and is well known to those skilled in the art. The RCA process or a similar cleaning process may include a first standard clean (SC-1) cycle ($NH_4OH+H_2O_2$), a rinse of dionized (DI) water ending with IPA vapor in $N_2$), an SC-2 clean ($HCl+H_2O_2$), and a rinse (DI water ending with IPA vapor in $N_2$).

The application of IPA vapor in $N_2$ can be accomplished while DI water still exists on the wafer. As a result, some of the previous cleaning chemicals still remain on the wafer, immersed in the DI water. The use of IPA vapor in $N_2$ 160 by blowing on the wafer 106 can reduce the rinse time since it begins prior to completing the rinse, i.e. complete removal of the cleaning chemicals by the DI water. The effect of the IPA vapor in $N_2$ 160 is to assist the rinse cycle and shorten the rinse cycle duration. The IPA vapor in $N_2$ 160 can be applied through the nozzle 126 to support a rinse cycle on the topside 116 of the wafer 106. The second nozzle 126 can be also used in the process or the second nozzle 126 can be placed off-center to the wafer axis of rotation 104 if not used. In yet another embodiment (not shown), more than two nozzles can be used which can be positioned in a variety of other patterns, such as equally distant from the axis 104, so as to provide chemical and gas coverage onto the topside 116 of the wafer.

The temperature of the cleaning chemicals, as well as the rinsing chemicals, etchants, and gasses can be between 15–85° C. during use. A drain 162 may be provided within the single wafer cleaning chamber 100 to collect the cleaning fluids.

In one embodiment, after the chemicals are dispensed, the wafer rotation can be slowed so that the cleaning chemicals remain trapped between the wafer and the platter to keep the chemicals wetted out on the wafer top surface. In one embodiment, the initial wafer spin rate can in the range of approximately 50–300, where an rpm of 150 is preferable, while the cleaning solutions are applied. In one embodiment, once the top surface (device side) of the wafer is wetted with chemicals, the wafer rotation speed may be reduced to a range of approximately 10–50, where an rpm of approximately 15 is preferable. In addition, the cleaning solutions can be applied at a lower rate, which in either case can reduce the cycle time and result in conserving chemical use. Finally, after the cleaning process, during a rinse and/or dry cycle, the rpm can be increased to over 1000 to remove the chemicals remaining on the wafer.

After the completion of a cleaning, etch, and/or rinse cycle, there can be a dry cycle to dry the wafer. In one embodiment, prior to the dry cycle (i.e. the end of a rinse cycle) the process can apply a few milliliters of isopropyl alcohol (IPA) vapor, mixed with nitrogen gas ($N_2$) 160 to the wafer 106. This can be accomplished by injection through the fluid feed port 128, with the vapors contacting the wafer device side 116 and non-device side 122. The IPA vapor, having a lower surface tension than water, will wet out the wafer surfaces 116 and 122 better and form a smaller boundary layer. During IPA vapor 160 application, the wafer 106 can be rotated at a speed that is greater than 1000 revolutions per minute (rpm). A combination of high wafer rpm, IPA vapor as a wetting agent, and $N_2$ gas pressure striking the wafer 106 can reduce the subsequent drying time for the wafer 106.

With or without an IPA vapor cycle, thermophoretic drying of the wafer can proceed next. Wafer rpm can be maintained at over 1000 rpm. The two nozzles 126 and 128 can be pivoted 130 and 132 respectively to positions over the wafer center of rotation 104. The dionized water 120 (first liquid) flowing through the nozzles 126 and 128 can be chilled to a temperature as low as 4 degrees C. with approximately 20 degrees C. preferred. Heated dionized water 121 (second liquid) can flow from below and through the feed port 129 to heat the wafer 106 by contacting the wafer bottom surface 116. The heated dionized water 120 can be heated to a temperature of approximately 80 degrees C. A temperature delta between the chilled dionized water 120 applied by the nozzles 126 and 128 and the heated wafer 106 of approximately 50 degrees C. is preferred. In an alternate embodiment, the wafer can be heated by UV lamps 170 (shown in phantom) instead of flowing a second liquid 121 that is heated onto the wafer bottom surface. It is to be appreciated pure water is required for the first liquid and the second liquid and that purified processes other than dionized water can be used. As a result, the dionized water referenced in this application can include water made by other processes that provide such purity.

In the foregoing specification, the invention has been described with reference to specific exemplary embodiments thereof. It will, however, be evident that various modifications and changes may be made thereto without departing from the broader spirit and scope of the invention as set forth in the appended claims. The specification and figures are, accordingly, to be regarded in an illustrative rather than a restrictive sense.

I claim:

1. A method, comprising:
    rotating a wafer;
    heating the wafer;
    applying a first liquid through one or more nozzles to a center of a topside of the wafer, wherein the liquid is cooler than the heated wafer; and
    creating a moving thermal gradient across the wafer, comprising:
    translating the one or more nozzles to an outer diameter edge of the wafer.

2. The method of claim 1, wherein the first liquid is at least 20 degrees C. cooler than the heated wafer.

3. The method of claim 2, wherein more than one nozzle is used and the more than one nozzle each translates toward the wafer outer diameter at a rate that maintains a common radius during the translation.

4. The method of claim 1, wherein the first liquid is applied at a temperature no less than 4 degrees C.

5. The method of claim 1, wherein the wafer is heated by UV lamps to a temperature of up to 80 degrees C.

6. The method of claim 1, wherein the wafer is heated by applying a heated second liquid to a bottom side of the wafer.

7. The method of 6, wherein the second liquid is heated to heat the wafer to a temperature of approximately 80 degrees C., or less.

8. The method of claim 6, wherein the second liquid is dionized water.

9. The method of claim 1, wherein an area of the wafer top surface is substantially covered by the first liquid that exists between one or more points of application of the first liquid onto the wafer top surface and the wafer outer diameter.

10. The method of claim 1, wherein a linear translate rate for the one or more nozzles in the radial direction is approximately 3 cm/sec.

11. The method of claim 1, wherein the first liquid is dionized water.

12. The method of claim 1, wherein the first liquid is applied as a solid stream of fluid.

13. The method of claim 1, wherein the first liquid is applied with an entrained gas.

14. The method of claim 1, wherein the first liquid is applied as a spray of droplets.

15. The method of claim 13, wherein the entrained gas is chosen from the group consisting of O2, N2, Ar, or He.

16. The method of claim 1, wherein a rotation rate for the wafer is up to approximately 6000 rpm.

17. The method of claim 1, wherein an HE-Last process immediately precedes the application of the first liquid.

18. The method of claim 17, wherein between the HF-Last process and the application of the first liquid, isopropyl alcohol vapor in nitrogen gas is applied to the wafer topside surface where the application initiates at the wafer center and translates radially toward the wafer outer diameter.

19. A method, comprising:
    rotating a wafer;
    heating the wafer;
    applying a first fluid through at least one nozzle to the topside of the wafer, wherein said first fluid is cooler than the heated wafer, thereby establishing a sustained thermal gradient between the first fluid and the wafer, thus producing a thermophoretic force on contaminants on the wafer surface; and
    translating the at least one nozzle to an outer diameter edge of the wafer, wherein said sustained thermal gradient also translates to the outer diameter edge of the wafer, thus generating a traveling thermal gradient.

20. The method of claim 19, wherein said traveling thermal gradient generates a traveling liquid to wafer interface, in which the wafer is relatively dry.

21. The method of claim 19, wherein said wafer has a rotational speed so as to maintain an approximately uniform desired thickness of coating of the first fluid on the device side of the wafer.

22. The method of claim 21, wherein the said thickness of the coating of the first fluid is approximately equal to or greater than 100 microns.

23. The method of claim 19, wherein said first fluid is applied by any combination of a continuous flow and a mist.

24. The method of claim 19, further including, prior to the application of the first fluid, the application of a wetting agent to the wafer topside surface where the application initiates at the wafer center and translates radially toward the outer diameter of the wafer.

25. The method of claim 24, further including an HF-Last process preceding the application of the first liquid and the application of the wetting agent.

26. The method of claim 25, wherein said wetting agent comprises isopropyl alcohol vapor in an inert gas.

27. A method, comprising:
    rotating a wafer, wherein the wafer is placed on a chuck, said chuck being capable of rotation;
    heating the wafer, wherein the wafer is heated by applying a heated second fluid to a bottom side of the wafer, wherein the heated second fluid is dispensed from below by a means of a through hole in a platter, wherein said platter and said chuck are positioned a distance from each other, thereby creating a gap between the platter and the chuck through which the heated second fluid can flow;
    applying a first fluid through one or more nozzles to the device side of the wafer, wherein said first fluid is cooler than the heated wafer, thereby establishing a sustained thermal gradient between the first fluid and the wafer; and translating the one or more nozzles to an outer diameter edge of the wafer, wherein said sustained thermal gradient also translates to the outer diameter edge of the wafer.

28. The method of claim 27, wherein said one or more nozzles apply a first fluid selected from one or more fluids from the group consisting of an inert fluid, a non-reactive fluid, a cleaning fluid or solution, a rinse fluid or solution, an etching fluid or solution, a wetting agent, isopropyl alcohol, purified or de-ionized water, in any combination thereof, or in any sequential combination thereof.

29. The method of claim 27, further including the application of sonic energy to the wafer.

30. The method of claim 29, wherein the applied sonic energy are megasonic sound waves.

31. The method of claim 30, wherein the megasonic sound waves comprise one or more frequencies in the range from about 350 kHz to the megahertz range.

32. The method of claim 29, wherein the sonic energy can be varied by varying one or more of the following parameters selected from the group comprising of power settings of one or more frequencies, changes in one or more frequencies, pulsating one or more frequencies, or any combination thereof.

33. The method of claim 29, wherein the sonic energy strikes the wafer from the back side of the wafer.

34. The method of claim 33, wherein the sonic energy passes through the second fluid, which contacts the backside of the wafer, before the sonic energy reaches the backside of the wafer.

35. The method of claim 29, wherein said sonic energy is generated from one or more transducers, which are located in a position closer to the backside of the wafer than to the device side of the wafer.

36. The method of claim 27, wherein said platter and said chuck are approximately parallel and the gap formed is approximately between 1 to 5 mm.

37. The method of claim 1, wherein at least one nozzle remains stationary, while one or more other nozzles are translating.

* * * * *